United States Patent
Bathey

[19]

[11] Patent Number: 6,143,633
[45] Date of Patent: *Nov. 7, 2000

[54] IN-SITU DIFFUSION OF DOPANT IMPURITIES DURING DENDRITIC WEB GROWTH OF CRYSTAL RIBBON

[75] Inventor: Balakrishnan R Bathey, Upper St. Clair, Pa.

[73] Assignee: Ebara Solar, Inc., Large, Pa.

[*] Notice: This patent issued on a continued prosecution application filed under 37 CFR 1.53(d), and is subject to the twenty year patent term provisions of 35 U.S.C. 154(a)(2).

[21] Appl. No.: 08/725,454

[22] Filed: Oct. 4, 1996

Related U.S. Application Data

[60] Provisional application No. 60/004,817, Oct. 5, 1995.

[51] Int. Cl.$^7$ ............................ C30D 15/04; H01L 31/18
[52] U.S. Cl. ........................... 438/567; 117/26; 117/932; 438/542; 438/557; 136/252; 136/261
[58] Field of Search .................................. 117/23, 26, 35, 117/209, 932; 438/542, 548, 558, 557, 565, 567, 45, 47; 136/252, 261

[56] References Cited

U.S. PATENT DOCUMENTS

| | | |
|---|---|---|
| 3,977,934 | 8/1976 | Lesk ........................................ 156/608 |
| 4,028,151 | 6/1977 | Lindmayer . |
| 4,033,790 | 7/1977 | Gunjigaki et al. ........................ 148/22 |
| 4,341,589 | 7/1982 | Grabmaier . |
| 4,360,393 | 11/1982 | Koval . |
| 4,428,783 | 1/1984 | Gessert . |
| 4,523,966 | 6/1985 | Tsuya . |
| 4,556,437 | 12/1985 | Molee ..................................... 148/188 |
| 4,729,962 | 3/1988 | Campbell .................................... 437/2 |
| 4,786,479 | 11/1988 | Hundal et al. ............................ 422/248 |
| 5,106,763 | 4/1992 | Bathey . |
| 5,156,978 | 10/1992 | Bathey . |
| 5,635,422 | 6/1997 | Lojek ....................................... 438/567 |

FOREIGN PATENT DOCUMENTS

| | | |
|---|---|---|
| 0 369 574 | 5/1990 | European Pat. Off. . |
| 2 620 135 | 3/1989 | France . |
| 412816 | 5/1996 | Switzerland . |

OTHER PUBLICATIONS

"Dendritic Web Silicon for Solar Cell Application", Journal of Crystal Growth, 39, 1977, Seidensticker.

In–Situ PN Junction Formation During Edge Defined Film–Fed Growth of Silicon, Bathey 23rd IEEE Photo . Spec. Conf., 1993.

Campbell et al., entitled "Status of Solar Cells and Modules Fabricated from Dendritic Web Silicon" Photovoltaic Specialists Conference, Las Vegas, Institute of Electrical and Electronics Engineers, published (1985) pp. 465–469.

*Primary Examiner*—Nam Nguyen
*Assistant Examiner*—Michael C. Miggins
*Attorney, Agent, or Firm*—Graham & James LLP

[57] ABSTRACT

A dendritic web formation process and apparatus for diffusing dopant impurities into a growing dendritic crystal web to produce photovoltaic cells. A solid dopant diffusion source is arranged in a holder mounted in a vertical thermal element either within the melt furnace or outside the furnace adjacent the furnace exit port. The solid diffusion source is heated by thermal conduction from the vertical thermal element and source holder using the furnace heat as a source. Auxiliary heater coils are optionally provided around the vertical thermal element to control the temperature of the solid diffusion source. The source and holder can also be mounted outside the furnace adjacent the exit port and heated using a secondary rapid temperature external heater. The growing dendritic crystal web is exposed to the dopant impurities as part of the web growing process, eliminating the need for a separate diffusion gaseous station and processing.

26 Claims, 6 Drawing Sheets

IN-SITU DIFFUSION OF DOPANT IMPURITIES DURING DENDRITIC WEB GROWTH OF CRYSTAL RIBBON

CROSS-REFERENCE TO PROVISIONAL APPLICATION

This application claims priority based on provisional application Serial No. 60/004,817 filed Oct. 5, 1995, for IN-SITU DIFFUSION OF BORON OR PHOSPHORUS DURING DENDRITIC WEB GROWTH OF SILICON RIBBON.

BACKGROUND OF THE INVENTION

This invention relates to the field of solar cells for converting solar energy into electrical energy. More particularly, this invention relates to dendritic web photovoltaic cell technology.

Solar cells comprising semiconductor devices employing the photovoltaic effect for converting solar energy into electrical energy have long been known. A known particular type of solar cell is made using the dendritic crystal web growing technique in which a source material, such as silicon, is melted in a furnace and slowly withdrawn using a seed crystal attached to a suitable mechanical drawing apparatus along a path from the source melt through a furnace exit port to a receiving station. Under suitable temperature controlled conditions and a proper withdrawal rate, the melt material forms a crystalline web having a dendritic cross-section which cools to a finished crystalline web. This process is more fully described in "Dendritic Web Silicon For Solar Cell Application", R. G. Seidensticker, *Journal of Crystal Growth,* 39 (1977) PP. 17–22, the disclosure of which is hereby incorporated by reference.

In order to provide the photovoltaic effect, semiconductor junctions must be formed within the crystalline web using a suitable dopant technique. One popular technique employed is the dopant diffusion process in which a dopant material is diffused into the crystalline web via the two major web surfaces to provide first and second diffusion layers of opposite conductivity type. Diffusion has been done in the past using a gas diffusion process in which the dopant material is in the form of a gas stream which is permitted to flow past the web surfaces so that ions of the dopant materials can be diffused into the crystalline web material. This process must necessarily be carried out well downstream of the crystalline web formation site, and typically requires a separate diffusion station, which adds complexity to the dendritic solar cell production process. In addition, gaseous diffusion requires separate gas sources (for the dopant materials of opposite conductivity type) and carefully designed and fabricated gas flow paths to prevent the dopant gas streams from escaping to ambient or contaminating other equipment.

SUMMARY OF THE INVENTION

The invention comprises a method and apparatus for in-situ diffusion of dopant impurities into one or both of the major web surfaces of a growing crystalline web which avoids the disadvantages attendant upon the gas diffusion process, which is relatively uncomplicated to implement in existing melt furnaces and which employs solid dopant diffusion source materials to provide the requisite concentrations of dopant materials.

From a process standpoint, the invention comprises a method of fabricating a dendritic web photovoltaic crystal ribbon including the steps of growing a dendritic crystal web having two major surfaces from a melt source in a furnace by drawing melt material along a path from the melt source and permitting the melt material to cool, and exposing at least one of the two major surfaces of the growing web to a solid dopant material heated to a diffusion temperature as the growing web is drawn along the path. When the method is performed by exposing both major surfaces of the growing web to a solid dopant material, one of the major surfaces is exposed to a first dopant material and the other one of the major surfaces is exposed to a second dopant material, the first and second dopant materials providing dopants of opposite conductivity type.

The web is exposed by placing a solid dopant material, preferably in planar form, in a holder adjacent a thermal source to heat the solid dopant material to the diffusion temperature. The thermal source preferably includes a solid thermal element, which is heated alternatively by subjecting the thermal element to heat contained in the furnace or heating the thermal element with a heating coil.

The step of exposing the web to the solid dopant material may be performed either inside the furnace or outside the furnace. When performed outside the furnace, the solid dopant material is placed in thermal contact with the thermal source adjacent the exit port, and the thermal source preferably includes a rapid thermal heater fixture, such as a resistance heater of conventional design.

From an apparatus standpoint, the invention comprises a furnace having means for producing a melt source of crystal growing material, and an exit port; means for drawing melt material along a path from the melt source through the exit port so that a dendritic crystal web having two major surfaces is grown as the melt material is drawn along the path; a solid dopant material arranged along the path in facing relation to at least one of the two major surfaces of the dendritic crystal web; and means for heating the solid dopant material to a diffusion temperature so that the growing dendritic crystal web is exposed to the solid dopant material in order to create a diffusion layer in at least one of the two major surfaces. The solid dopant material is preferably received in a holder mounted along the path and located either within the furnace or outside the furnace adjacent the exit port.

The means for heating the solid dopant material includes a thermal element located along the path and at least partially surrounding the dopant material, with the solid dopant material arranged in thermal contact with the thermal element. An optional auxiliary heating coil may be arranged about the thermal element for controlling the temperature. When the heating means is located outside of the furnace, preferably adjacent the exit port, an auxiliary rapid temperature external heater is provided, preferably an electrically powered resistance heater element.

The apparatus may be arranged with single-sided or double-sided dopant capabilities. When arranged for double-sided dopant operation, the solid dopant material comprises a first dopant material element arranged in facing relation to one of the first and second major surfaces of the growing dendritic crystal web, and a second dopant material element arranged in facing relation to the other one of the first and second major surfaces of the dendritic crystal web so that each of the first and second dopant material elements functions as a diffusion source for the corresponding facing major surface of the growing dendritic crystal web. The first and second dopant material elements provide dopants of opposite conductivity types in the double-sided configuration.

For a fuller understanding of the nature and advantages of the invention, reference should be made to the ensuing detailed description, taken in conjunction with the accompanying drawings.

DETAILED DESCRIPTION OF THE PREFERRED EMBODIMENTS

Figure 1:
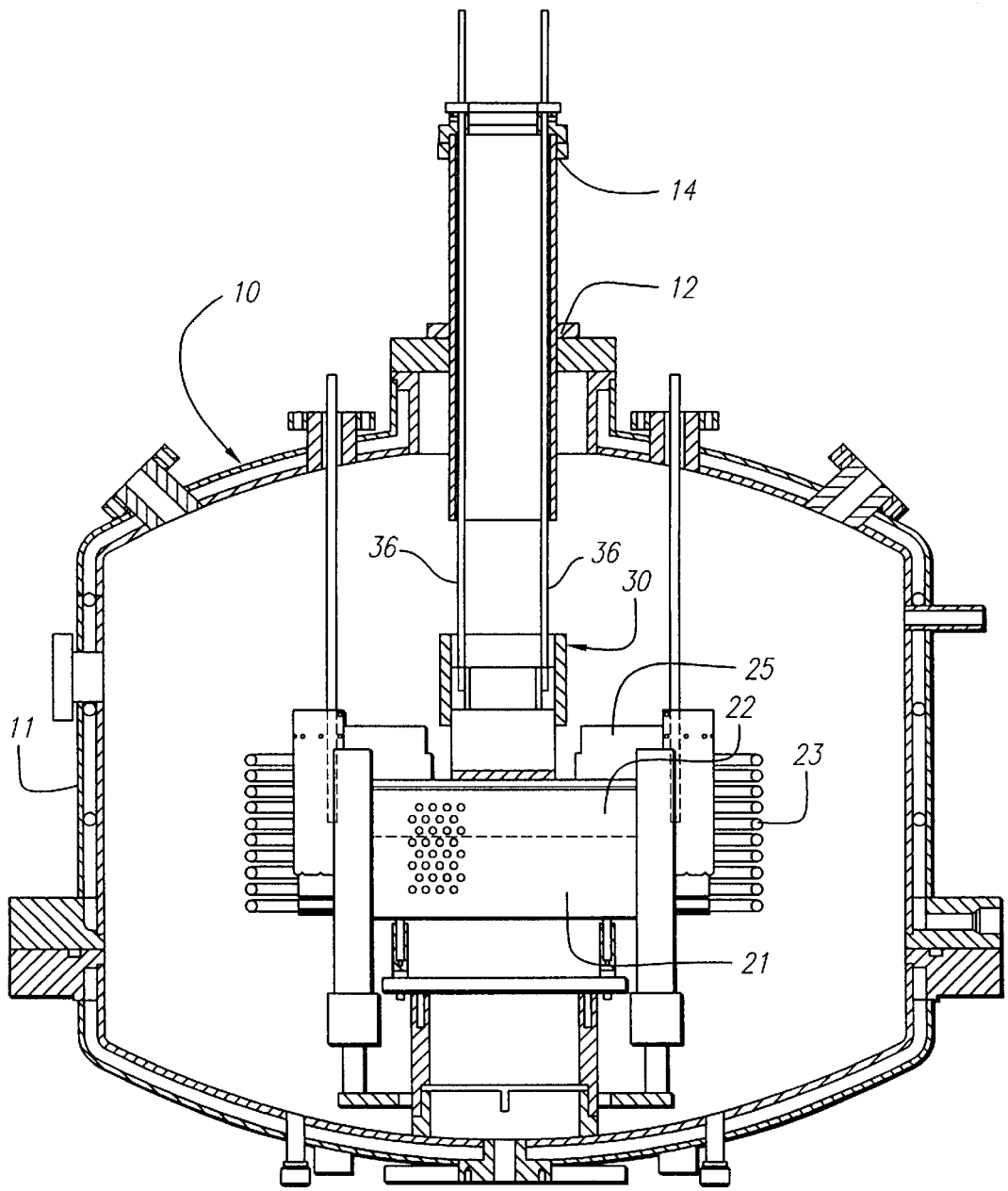
FIG. 1 is a sectional view of a first embodiment of the invention.
Figure 2:
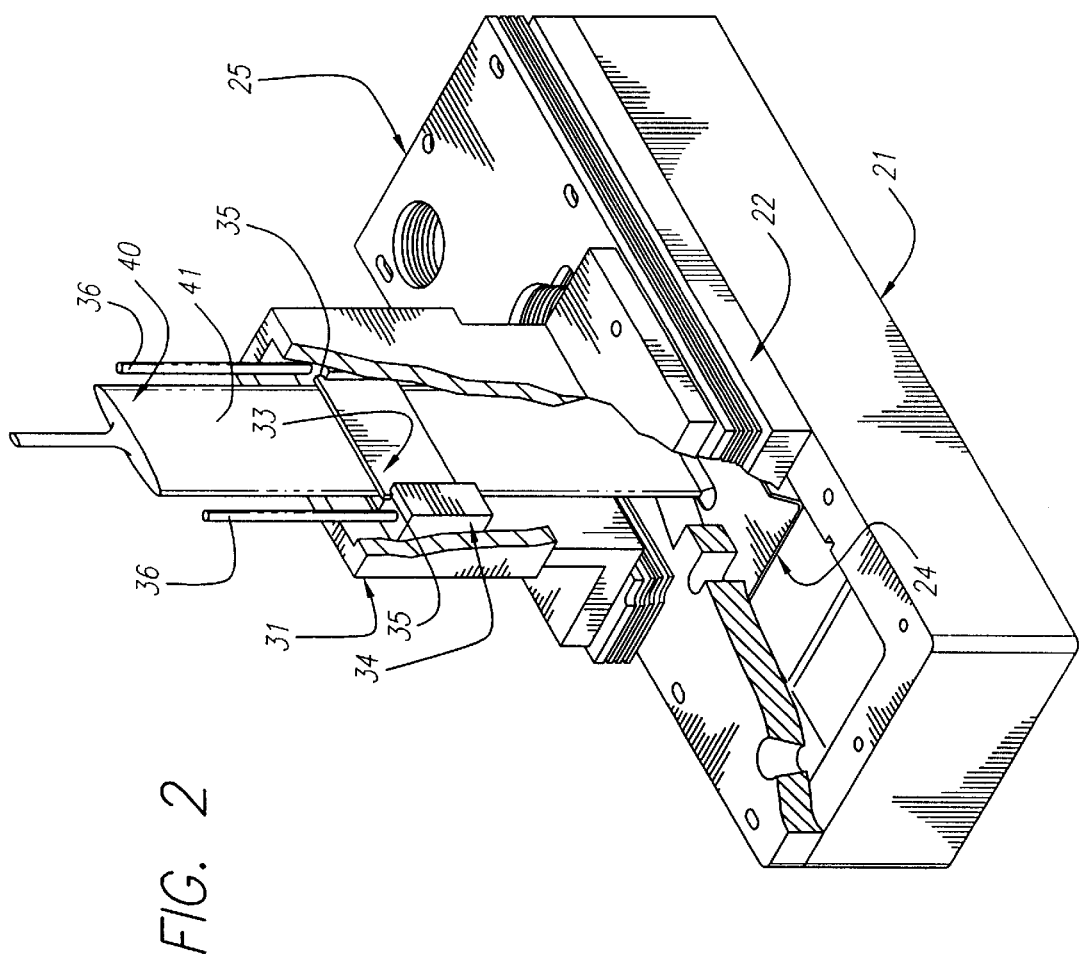
FIG. 2 is a perspective view partially broken away illustrating a portion of the FIG. 1 embodiment.

Turning now to the drawings, FIGS. 1 and 2 illustrate a first embodiment of the invention in which a vertical thermal element and solid diffusion source and holder are positioned within a web growing furnace. With reference to FIG. 1, a conventional furnace generally designated with reference numeral 10 has an outer wall structure 11 with an exit port 12. Secured to wall structure 11 adjacent exit port 12 is a web drawing support fixture 14 for enabling a growing web initially formed inside the furnace 10 to be withdrawn by means of a conventional web drawing mechanism (not shown) and transferred to a receiving station. Since the web drawing mechanism and receiving station are well known, conventional devices, further description is deemed unnecessary in order to avoid prolixity.

Arranged within furnace 10 is a susceptor 21 for retaining a melt crucible (element 24 shown in FIG. 2) in which the melt material (typically silicon) is maintained in a liquid state. An RF heater coil 23 is arranged about susceptor 21 for the purpose of heating the silicon in the crucible in a conventional manner. Arranged above a lid portion 22 of susceptor 21 are a plurality of shields 25. Positioned centrally of shields 25 is an in-situ diffusion fixture and solid diffusion source generally designated with reference numeral 30.

With reference to FIG. 2, which is a perspective view partially broken away of susceptor 21, lid 22, shields 25 and the in-situ diffusion fixture and solid diffusion source 30, element 30 is seen to include a vertical thermal element 31 secured in any suitable fashion to the top surface of shields 25. Vertical thermal element 31 is preferably fabricated from graphite and serves as a thermal heat source for a solid diffusion source 33 positioned in a diffusion source holder 34. Solid diffusion source 33 is preferably a rectangular strip of diffusion source material, such as phosphorus or boron, and may be mounted in diffusion source holder 34 in any suitable fashion, such as by forming slots 35 along the inner facing surfaces of the end portions of holder 34. Holder 34 is preferably formed from graphite in order to provide a temperature stable additional heat sink for diffusion source 33. A pair of rods 36 are secured to holder 34 in any suitable fashion, such as by forming tapped holes extending from the upper surface inwardly of the body of holder 34. Rods 36 extend upwardly of furnace 10 (see FIG. 1) and exit through exit port 12 to a rod manipulating fixture (not shown) in order to enable holder 34 and source 33 to be positioned within and removed from vertical thermal element 31.

Again with reference to FIG. 2, diffusion source 33 is arranged in facing relation with a major surface 41 of growing dendritic web 40 which is drawn upwardly by the web withdrawing mechanism described above. As the growing web passes through the zone of the solid diffusion source 33, dopant ions thermally driven from diffusion source 33 diffuse into the surface and interior of web 40. By controlling the temperature of source 33, the withdrawal rate of web 40, the vertical position of source 33, and the separation distance between source 33 and web 40, diffusion impurity concentrations of desired amounts and depths can be provided within web 40. The withdrawal rate, separation distance between source 33 and web surface 41 and temperature of source 33 are all typically determined empirically. Typical temperature ranges are from about 900° C. to about 1000° C. Typical web withdrawal rates are in the range of about 1.5 cm/min. Typical separation distances between source 33 and web surface 41 are in the range of about 100 mils.

While the arrangement shown for the embodiments of FIGS. 1 and 2 uses a single planar diffusion source 33 adjacent only one major surface 41 of web 40, a second diffusion source may be positioned within holder 34 in facing relation to the other major surface 42 of growing web 40 in order to provide simultaneous diffusion of dopant impurities into both surfaces of growing web 40.

Figure 3:
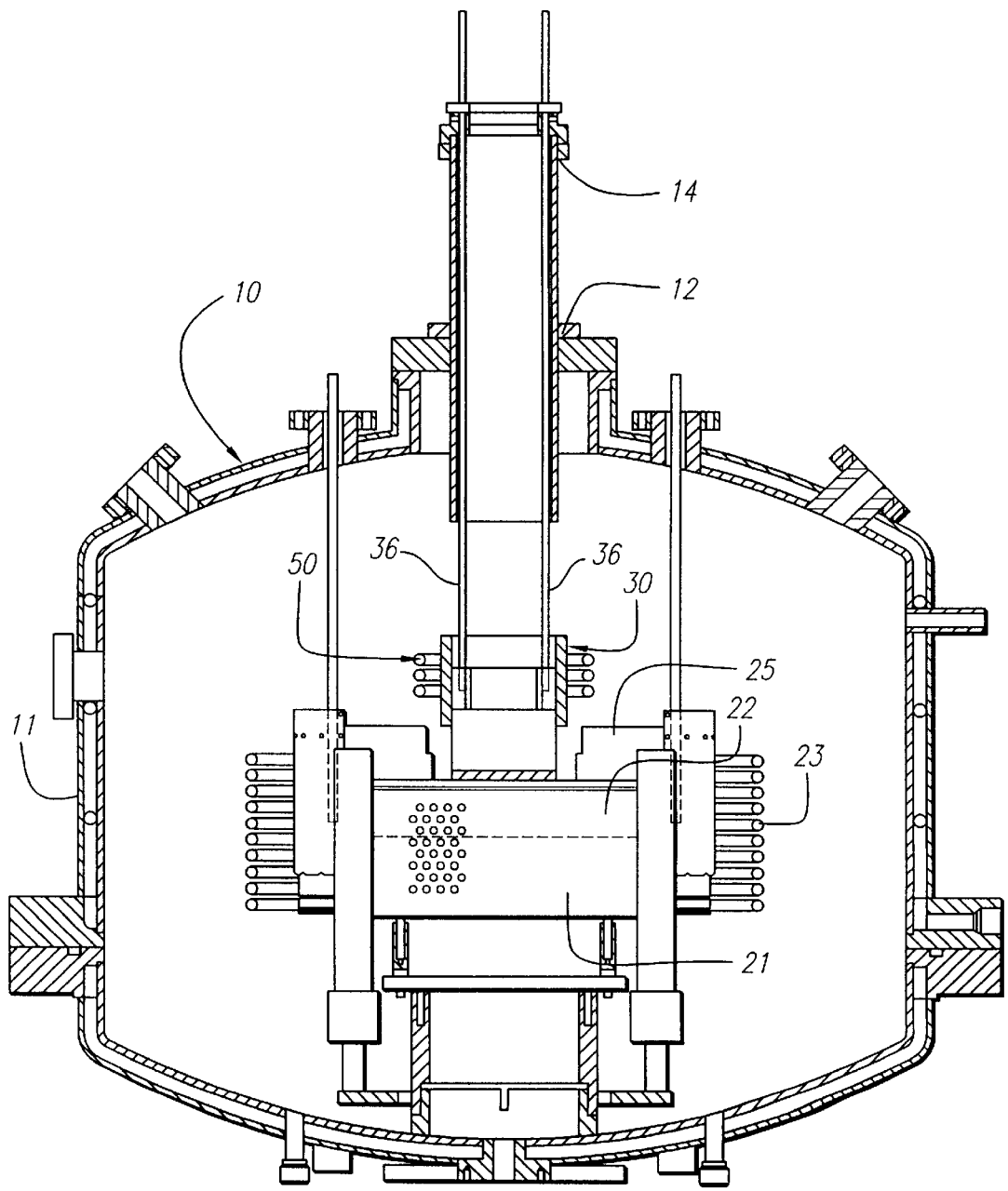
FIG. 3 is a sectional view of a second embodiment of the invention.
Figure 4:
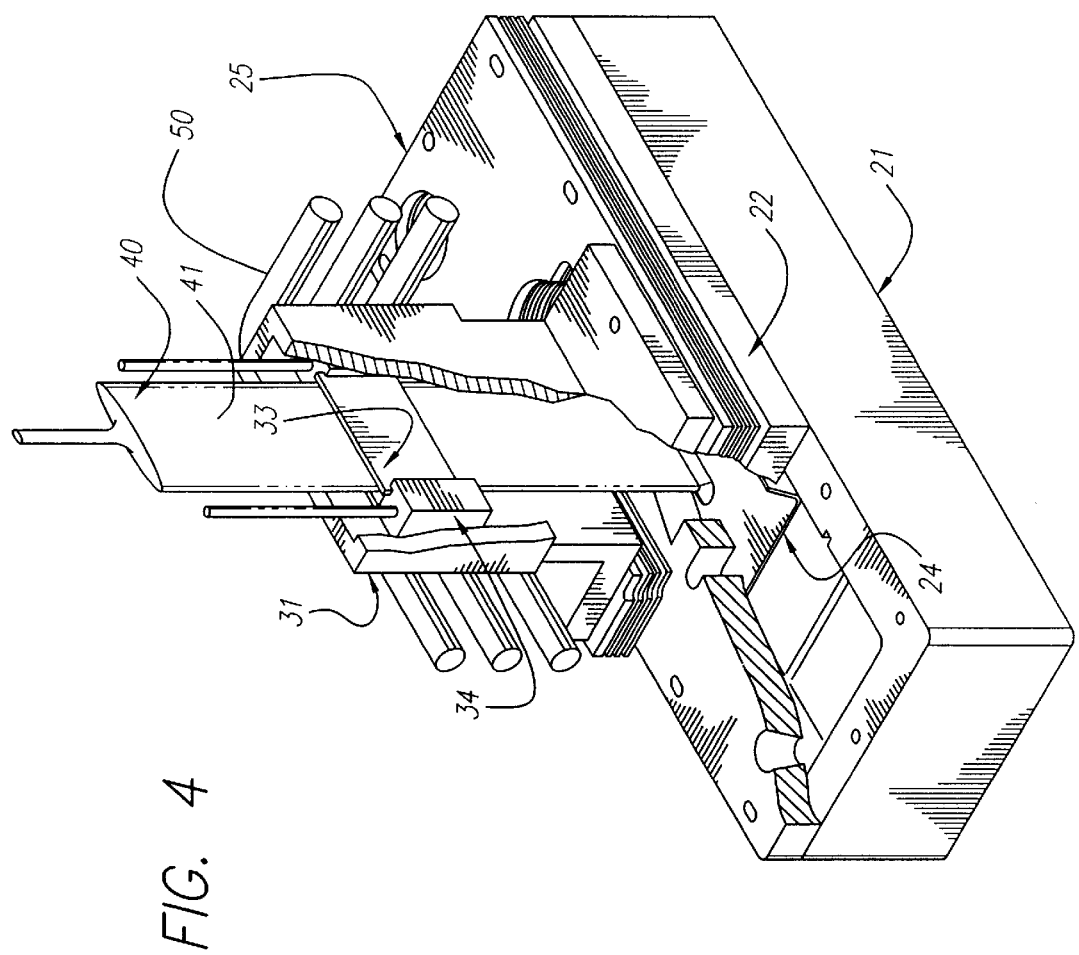
FIG. 4 is a partial perspective view illustrating a portion of the embodiment of FIG. 3.

In the embodiment of FIGS. 1 and 2, the temperature of vertical thermal element 31, holder 34 and diffusion source 33 is controlled by controlling the furnace temperature, and elements 31, 34 and 33 are heated by thermal conduction through shields 35 and also the ambient temperature within the furnace. The embodiments of FIGS. 3 and 4 illustrates a first alternate embodiment in which the temperature of elements 31, 33 and 34 is also controlled by auxiliary heating coils. With reference to FIGS. 3 and 4 in which elements common to the embodiment of FIGS. 1 and 2 are designated with identical reference numerals, a plurality of RF auxiliary heater coils 50 are arranged about vertical thermal element 31 and are used to provide auxiliary heating for the vertical thermal element 31, holder 34 and solid diffusion source 33. As with the embodiment of FIGS. 1 and 2, the FIGS. 3 and 4 embodiment may also include a second solid diffusion source positioned facing major surface 42 of growing web 40.

Figure 5:
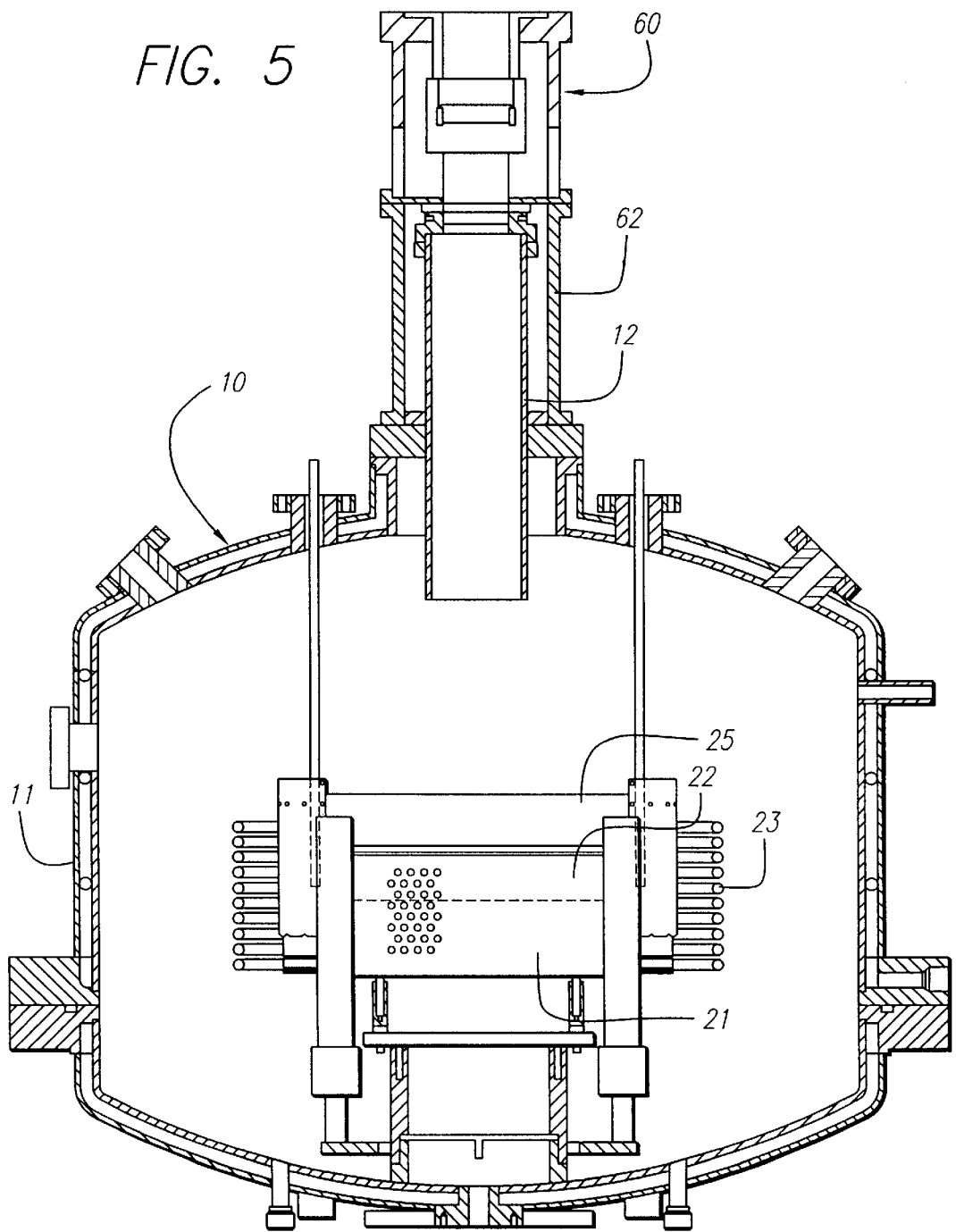
FIG. 5 is a sectional view of another embodiment of the invention.
Figure 6:
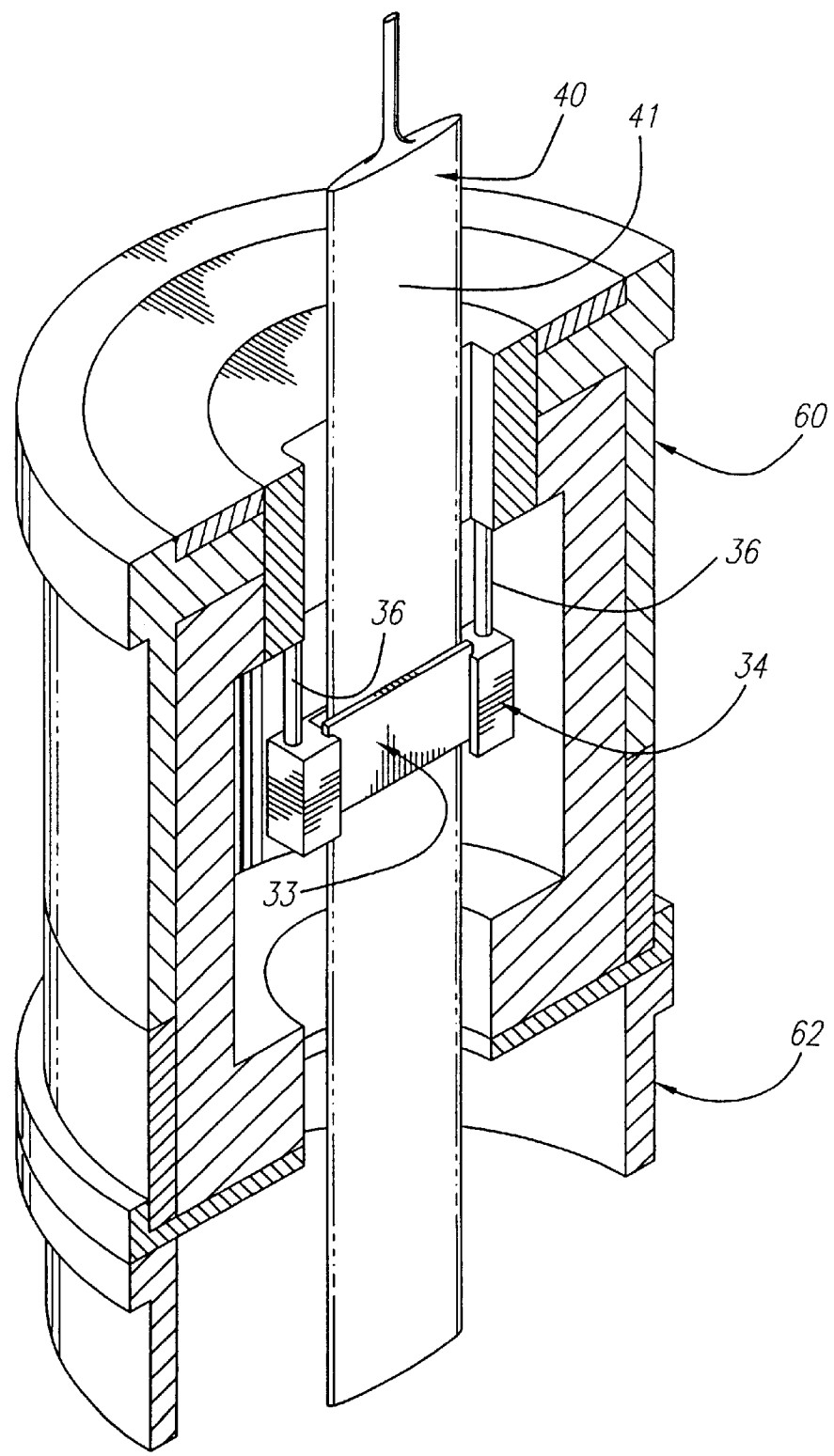
FIG. 6 is a perspective view partially broken away of a portion of the embodiment of FIG. 5.

FIGS. 5 and 6 illustrate still another alternate embodiment of the invention. In this embodiment, a rapid temperature external heater fixture 60 is mounted on a heater support column 62 outside furnace 10 adjacent exit port 12 to provide auxiliary heating for the growing web. The holder 34 and solid diffusion source 33 are both positioned within the external heater fixture 60, which provides easier access to these elements in order to facilitate installation and removal of the diffusion sources 33. In addition, the embodiment of FIGS. 5 and 6 eliminates vertical thermal element 31.

Attached as Appendix A are five sheets of drawing illustrating actual fixture details for vertical thermal element 31, source holder 34, rods 36 and ancillary components.

As will now be apparent, the invention permits in-situ diffusion of dopant materials into one or both major surfaces of the growing dendritic web emerging from the melt crucible. This arrangement eliminates the necessity for providing gaseous dopant diffusion sources and the attendant disadvantages of such diffusion source arrangements. In addition, the solid planar diffusion source may be easily installed and removed from the source holder, and the relative vertical position of the solid diffusion source 33 can be readily adjusted by means of rods 36 to provide source temperature adjustment. Perhaps most importantly, the invention eliminates the need for a separate diffusion station for the dendritic web formation process, which renders the production facility more compact and simplifies the installation, initial set-up and process operation when producing dendritic web photovoltaic cells.

While the above provides a full and complete disclosure of the preferred embodiments of the invention, various modifications, alternate constructions and equivalents may be employed, as desired. Therefore, the above description and illustrations should not be construed as limiting the scope of the invention, which is defined by the appended claims.

What is claimed is:

1. A method of fabricating a dendritic web photovoltaic crystal ribbon comprising the steps of:

(1) growing a dendritic crystal web including two major surfaces and a dendrite from a melt source in a furnace by drawing melt material along a path from the melt source and permitting the melt material to cool; and (2) directly exposing at least one of the two major surfaces of the growing web to a substantially flat surface of a solid dopant material heated to a diffusion temperature as the growing web is drawn along the path, wherein the substantially flat surface is maintained substantially parallel to the at least one of the two major surfaces, thereby diffusing some of said solid dopant material into said at least one of the two major surfaces.

2. The method of claim 1 wherein said step (2) of exposing includes the step of exposing both major surfaces of the growing web to a solid dopant material.

3. The method of claim 2 wherein said step of exposing includes the steps of exposing one of the major surfaces to a first solid dopant material and exposing the other one of the major surfaces to a second dopant material.

4. The method of claim 3 wherein the first and second solid dopant materials provide dopants of opposite conductivity type.

5. The method of claim 1 wherein said step (2) of exposing includes the step of placing a solid dopant material in a holder adjacent a thermal source to heat the solid dopant material to the diffusion temperature.

6. The method of claim 5 wherein said step of placing includes the steps of providing a solid thermal element and heating the thermal element.

7. The method of claim 6 wherein said step of heating is performed by subjecting the thermal element to heat contained in the furnace.

8. The method of claim 6 wherein said step of heating is performed by heating the thermal element with a heating coil.

9. The method of claim 1 wherein said step (2) of exposing is performed within the furnace.

10. The method of claim 1 wherein the furnace has a web exit port; and wherein said step (2) of exposing is performed outside the furnace.

11. The method of claim 10 wherein said step (2) of exposing includes the steps of providing a thermal source adjacent the exit port, and placing the solid dopant material in thermal contact with the thermal source adjacent the exit port.

12. The method of claim 1, wherein said solid dopant material is in planar form.

13. The method of claim 12, wherein said dopant material is arranged in facing relation to at least one of said two major surfaces of said dendritic crystal web.

14. The method of claim 12, wherein said solid dopant material is a rectangular strip.

15. An apparatus for fabricating a dendritic web photovoltaic crystal ribbon, said apparatus comprising:

a furnace having means for producing a melt source of crystal growing material, and an exit port;

means for drawing melt material along a path from the melt source through the exit port so that a dendritic crystal web including two major surfaces and a dendrite is grown as the melt material is drawn along the path;

a solid dopant material arranged along said path, said solid dopant material having a substantially flat surface maintained in facing relation and substantially parallel to at least one of said two major surfaces of said dendritic crystal web; and means for heating said solid dopant material to a diffusion temperature so that the growing dendritic crystal web is exposed to said solid dopant material in order to create a diffusion layer in said at least one of said two major surfaces.

16. The apparatus of claim 15 further including a holder mounted along the path for receiving said solid dopant material.

17. The apparatus of claim 16 wherein said holder is located within said furnace.

18. The apparatus of claim 16 wherein said holder is located outside said furnace adjacent said exit port.

19. The apparatus of claim 15 wherein said means for heating said solid dopant material includes a thermal element located along said path and at least partially surrounding said dopant material, said solid dopant material being arranged in thermal contact with said thermal element.

20. The apparatus of claim 19 wherein said means for heating said thermal element further includes a heating coil for heating said thermal element.

21. The apparatus of claim 19 wherein said means for heating is located within said furnace.

22. The apparatus of claim 19 wherein said means for heating is located outside said furnace adjacent said exit port.

23. The apparatus of claim 15 wherein said solid dopant material comprises a first dopant material element arranged in facing relation to one of said first and second major surfaces of said dendritic crystal web, and a second dopant material element arranged in facing relation to the other one of said first and second major surfaces of said dendritic crystal web so that each of said first and second dopant material elements functions as a diffusion source for the corresponding facing major surface of said growing dendritic crystal web.

24. The apparatus of claim 23 wherein said first and second dopant material elements provide dopants of opposite conductivity types.

25. The apparatus of claim 15, wherein said solid dopant material is in planar form.

26. The apparatus of claim 15, wherein said solid dopant material is a rectangular strip.

* * * * *